United States Patent
Mimino et al.

(10) Patent No.: US 6,787,909 B2
(45) Date of Patent: Sep. 7, 2004

(54) HIGH FREQUENCY SEMICONDUCTOR DEVICE

(75) Inventors: Yutaka Mimino, Yamanashi (JP); Osamu Baba, Yamanashi (JP); Yoshio Aoki, Yamanashi (JP); Muneharu Gotoh, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/084,919

(22) Filed: Mar. 1, 2002

(65) Prior Publication Data

US 2002/0139969 A1 Oct. 3, 2002

(30) Foreign Application Priority Data

Mar. 30, 2001 (JP) ......................................... 2001-099959

(51) Int. Cl.[7] .......................... H01L 23/48; H01L 23/52; H01L 29/40
(52) U.S. Cl. .................... 257/758; 257/508; 257/618
(58) Field of Search .............................. 257/503, 506, 257/507, 508, 513, 518, 633, 700, 701, 705, 712, 713, 752, 759, 9, 12, 14, 15, 20, 21, 23, 24, 698, 702, 706

(56) References Cited

U.S. PATENT DOCUMENTS

| | | | | |
|---|---|---|---|---|
| 4,417,701 A | * | 11/1983 | Moritz | 242/55 |
| 5,427,979 A | * | 6/1995 | Chang | 437/190 |
| 5,943,597 A | | 8/1999 | Kleffner et al. | 438/613 |
| 6,162,686 A | * | 12/2000 | Huang et al. | 438/281 |
| 6,353,189 B1 | * | 3/2002 | Shimada et al. | 174/255 |

FOREIGN PATENT DOCUMENTS

| | | |
|---|---|---|
| JP | 3-286541 | 12/1991 |
| JP | 04340271 A | * 11/1992 |
| JP | 9-270445 | 10/1997 |
| JP | 10-321804 | 12/1998 |
| JP | 2001-044706 | 2/2001 |

OTHER PUBLICATIONS

Copy of Taiwanese Patent Office Action including translation for corresponding Taiwanese Patent Application No. 91104616 dated Feb. 6, 2004.
Copy of Japanese Patent Office Action for corresponding Japanese Patent Application 2001-099959 dated Sep. 2, 2003 with translation.

* cited by examiner

*Primary Examiner*—Long Pham
*Assistant Examiner*—Dana Farahani
(74) *Attorney, Agent, or Firm*—Armstrong, Kratz, Quintos, Hanson & Brooks, LLP

(57) ABSTRACT

A structure for preventing MMICs (Monolithic Microwave Integrated Circuits) from deterioration in the high-frequency transmission characteristics thereof, which results from mechanical pressure applied to the pads during the wire-bonding thereto for external connection. The structure includes a groove provided in the surface of the interlayer insulation film around each of the pads. The line conductor for transmitting high-frequency signals is free from the peeling off or bending thereof, which is caused by the deformation in the interlayer insulation films during when the mechanical pressure applied to the pads, and thus, the change in the transmission characteristics of the line conductor can be minimized, and the reliability of MMICs can be improved.

12 Claims, 4 Drawing Sheets

HIGH FREQUENCY SEMICONDUCTOR DEVICE

BACKGROUND OF THE INVENTION

1. Field of the Invention

The present invention relates to an MMIC (Monolithic Microwave Integrated Circuit) having a wave guide for high-frequency signal transmission.

2. Description of the Related Art

In contrast to conventional silicon integrated circuits, MMICs comprising high-speed semiconductor devices such as that represented by HEMT (High Electron Mobility Transistor) or HBT (Hetero Bipolar Transistor) necessarily include a wave guide as the inner transmission line for high-frequency signals. Micro-strip lines are generally used as the high-frequency signal wave guide, because of their stable line characteristics and low dispersion characteristics which means that the frequency dependency of the propagation constant is weak.

FIG. 1 shows an MMIC having conventional micro-strip lines, in particular, a three-dimensional MMIC having micro-strip lines composed of multi-layered line conductors.

As shown in FIG. 1, the MIMIC having a conventional multi-layered structure includes ground plate 3 formed on the semiconductor substrate 1 with the insertion of surface insulation film 2 therebetween, and ground plate 3 forms micro-strip lines together with line conductors 5 each formed on each of interlayer insulation films 4, respectively. In addition to line conductors 5, a pad 6 for the external connection is provided on the most upper interlayer insulation film 4.

The MMIC having multi-layered high-frequency micro-strip lines, as explained with reference to FIG. 1, has features that are suited to high density integration, compared to MMICs having line conductors disposed in a single layer.

However, none of reports appear to discuss the reliability of such multi-layered high-frequency micro-strip lines so far.

SUMMARY OF THE INVENTION

It is an object of the present invention to provide a structure of a three-dimensional MMIC designed by taking reliability into consideration.

In three-dimensional MMICs, the interlayer insulation films are composed of a resin (organic) insulating material such as polyimide or benzocyclobutene (BCB).

The interlayer insulation film of such resin insulating material is relatively soft and is apt to deform when pressure is applied thereto. Pads, for instance, are subjected to a mechanical shock by the tip of a bonding tool during wire bonding thereto, and deformation is caused in the interlayer insulation film around there.

As a result, line conductor 5 on the most upper interlayer insulation film tends to peel off or bend. When wire bonding is over and application of the pressure by the bonding tool is removed, the interlayer insulation film can recover from the deformation by itself. However, the line conductor that is once peeled off or bent cannot be restored, and results in the change of its high-frequency transmission characteristics.

In the present invention, a groove is provided in the interlayer insulation film adjacent to the pad, for relaxing the influence of the deformation given during wire bonding processes.

FIG. 2 shows the essential concept of the present invention. As shown in the drawing, groove 7 is provided adjacent to pad 6, and thus, the PAD REGION and the WIRING REGION are physically separated from each other at least by the groove near the respective surfaces thereof. Accordingly, even when pad 6 is subjected to wire bonding processes, aforesaid deformation caused in the interlayer insulation film by the pressure applied to pad 6 is relaxed by the shape effect of groove 7, and the influence of the deformation on the WIRING REGION can be alleviated.

DESCRIPTION OF THE PREFERRED EMBODIMENTS

Embodiments of the present invention will be explained in the following with reference to drawings.

Figure 1:
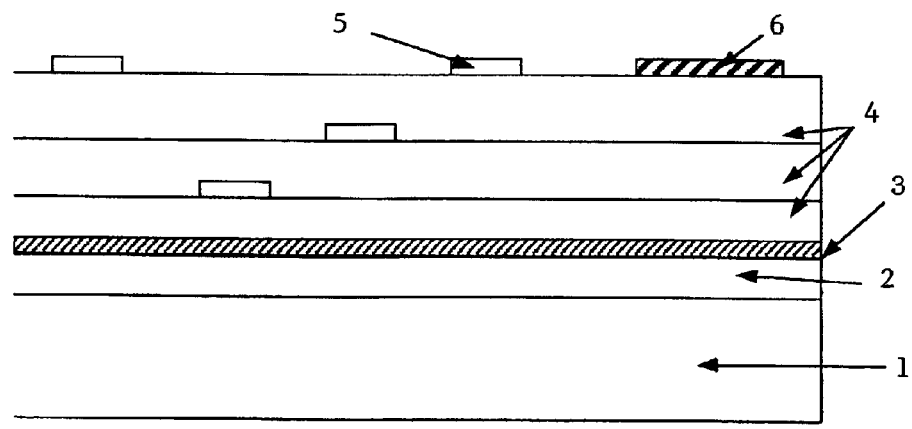
FIG. 1 is a cross-sectional view of an MMIC having conventional micro-strip lines.
Figure 2:
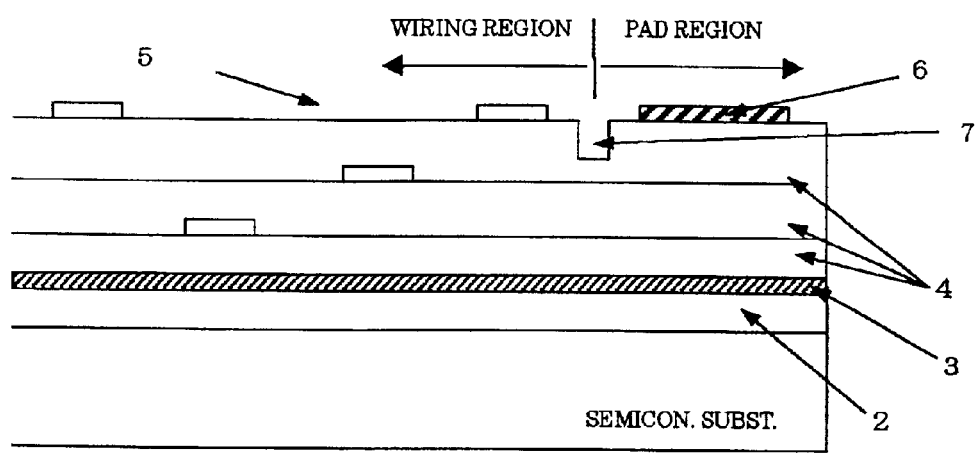
FIG. 2 is a cross-sectional view for explaining the essential concept of the present inveniton.
Figure 3:
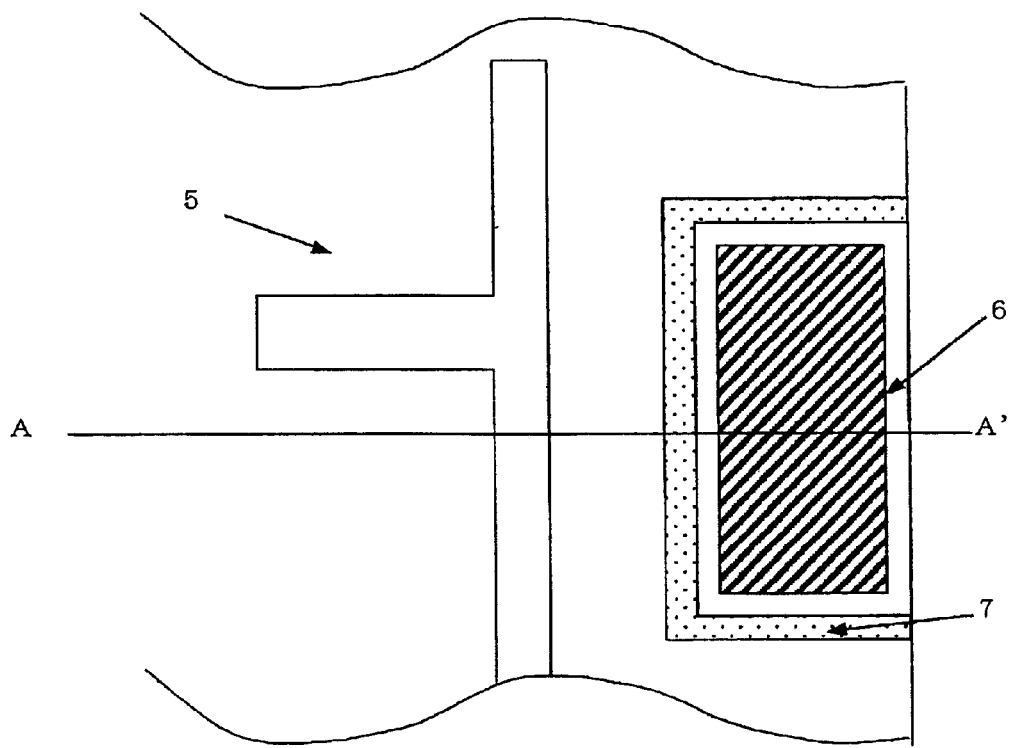
FIG. 3 is a plan view showing an embodiment of the present inveniton.
Figure 4:
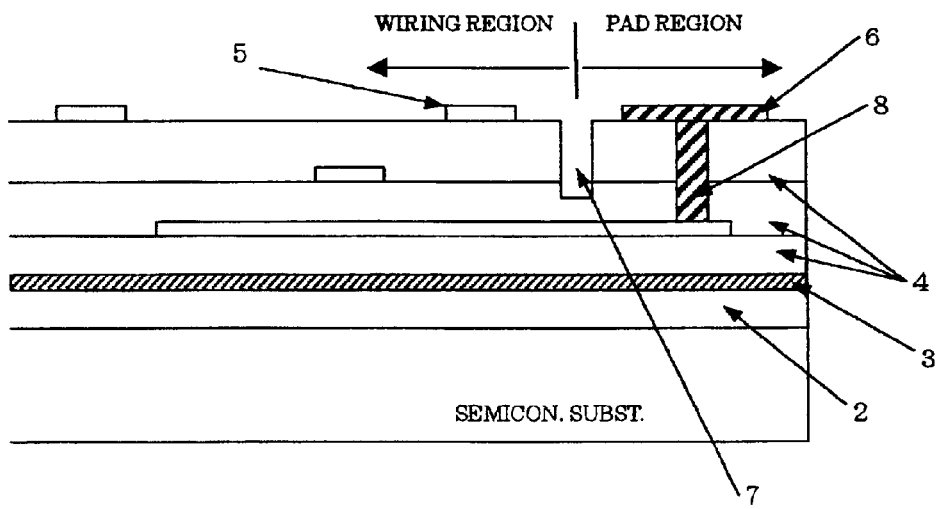
FIG. 4 is a cross-sectional view taken on segment line A–A' in FIG. 3.

FIG. 3 is a plan view of an embodiment of three-dimensional MMIC acconding to the present inveniton, and FIG. 4 is a cross-sectional view taken on segment line A–A' in FIG. 3.

In this embodiment, a compound semiconductor substrate of GaAs is used, in which active devices such as FETs are formed, and a surface insulation film 2 of silicon nitride, for instance, is formed on the surface of the substrate. A ground plate 3 to be connected to ground potential is formed on the surface insulation film 2, and a plurality of interlayer insulation films 4 are formed thereon. The interlayer insulation films are composed of polyimide or benzocyclobutene (BCB). On interlayer insulation films 4, line conductors 5 each having a predetermined pattern are formed, respectively. Each of line conductors 5 is formed from gold (Au) by using sputtering or vacuum deposition and patterned by using ion milling or lift-off technologies.

In this embodiment, groove 7 is formed to surround pad 6, except the side of pad 6, which is facing the edge of semiconductor substrate 1. Groove 7 is formed by using methods like etching. The depth of groove 7 can substantially be optional, such as that the same as the thickness of one of the interlayer insulation films, or deeper or shallower in terms of the thickness. In this embodiment, groove 7 is formed to extend into plural interlayer insulation films 4.

Pad 6 is formed in the same process as that for line conductor 5 on the most upper interlayer insulation film 4, and is connected via through hole 8 to another line conductor 5 extending immediately thereunder, to be used for internally supplying a potential.

According to this embodiment, the deformation caused in the interlayer insulation film during the wire bonding to pad 6 is relaxed by groove 7, and line conductor 5 on the most upper interlayer insulation film 4 can be prevented from peeling off or bending of itself.

In this embodiment, pad 6 is formed adjacent to the edge of the semiconductor substrate chip, and groove 7 is not provided at the periphery of the semiconductor substrate chip where none of line conductors is provided. However, groove 7 may be provided along whole of the periphery, according to need.

Figure 5:
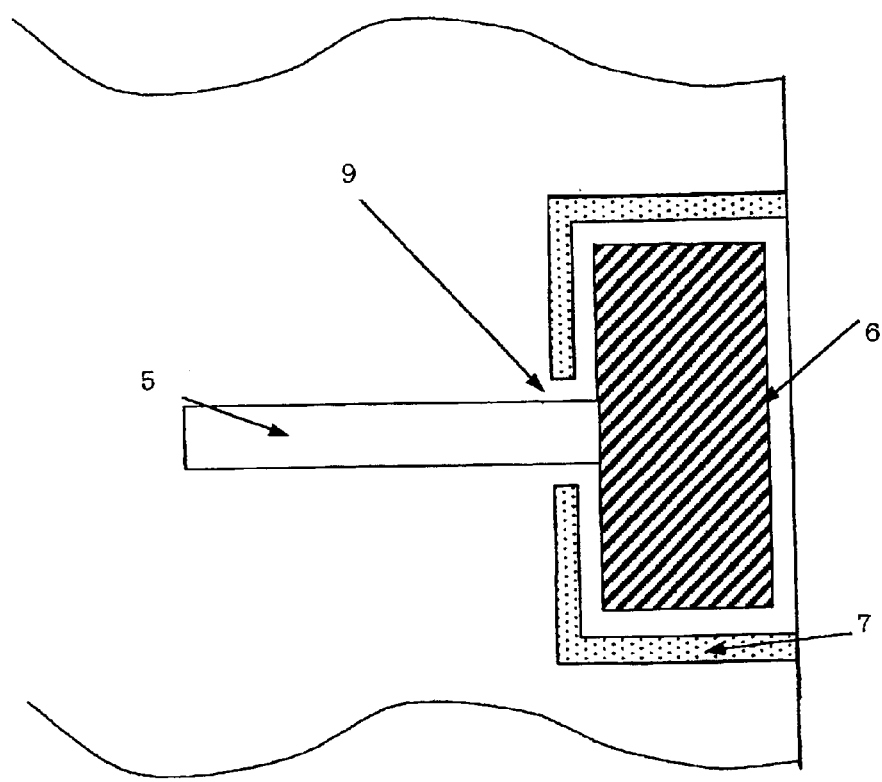
FIG. 5 is a plan view showing another embodiment of the present inveniton.

FIG. 5 is a plan view for explaining another embodiment of the present inveniton. In this embodiment, line conductor 5 is provided on the most upper interlayer insulation film on which pad 6 is provided, and is connected to pad 6, as shown in the drawing. Accordingly, a connection portion 9 where groove 7 is not formed is provided for allowing line conductor 5 to pass therethrough.

Also in this embodiment, the deformation of the interlayer insulation film caused by bonding pressure to pad 6 is relaxed by groove 7, and the shape change which would propagate into WIRING REGION can be reduced. A portion of PAD REGION is connected with WIRING REGION through connection region 9. However, the deformation by the bonding pressure applied to pad 6 is almost interrupted by the discontinuity provided in the interlayer insulation films by groove 7, and accordingly, line conductor 5 connected to pad 6 is hardly affected by the influence of the deformation.

Figure 6:
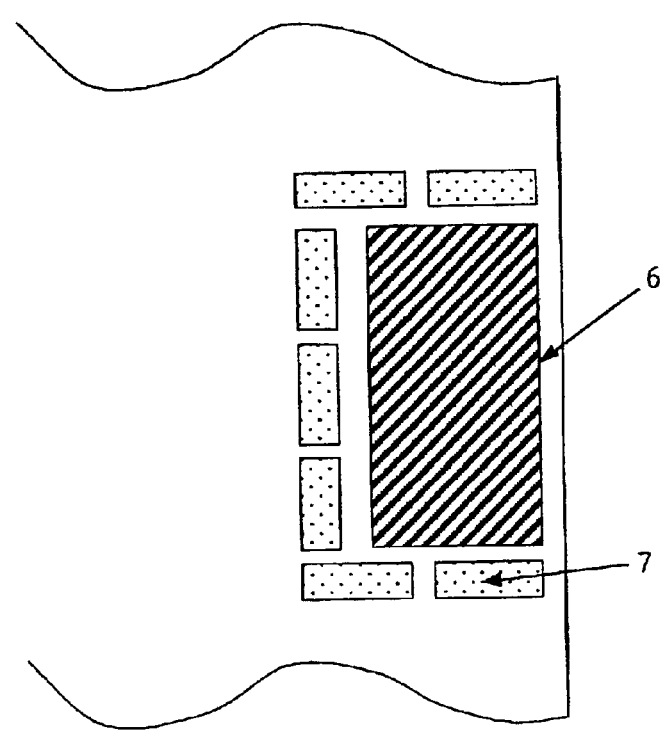
FIG. 6 is a plan view showing futher another embodiment of the present inveniton.

FIG. 6 is a plan view for explaining futher another embodiment of the present inveniton.

In this embodiment, plural grooves 7 are provided. Also in this embodiment, the deformation by the bonding pressure is relaxed by grooves 7 as in the previous embodiments, and the change in the shape of the insulation film in WIRING REGION is reduced.

Figure 7:
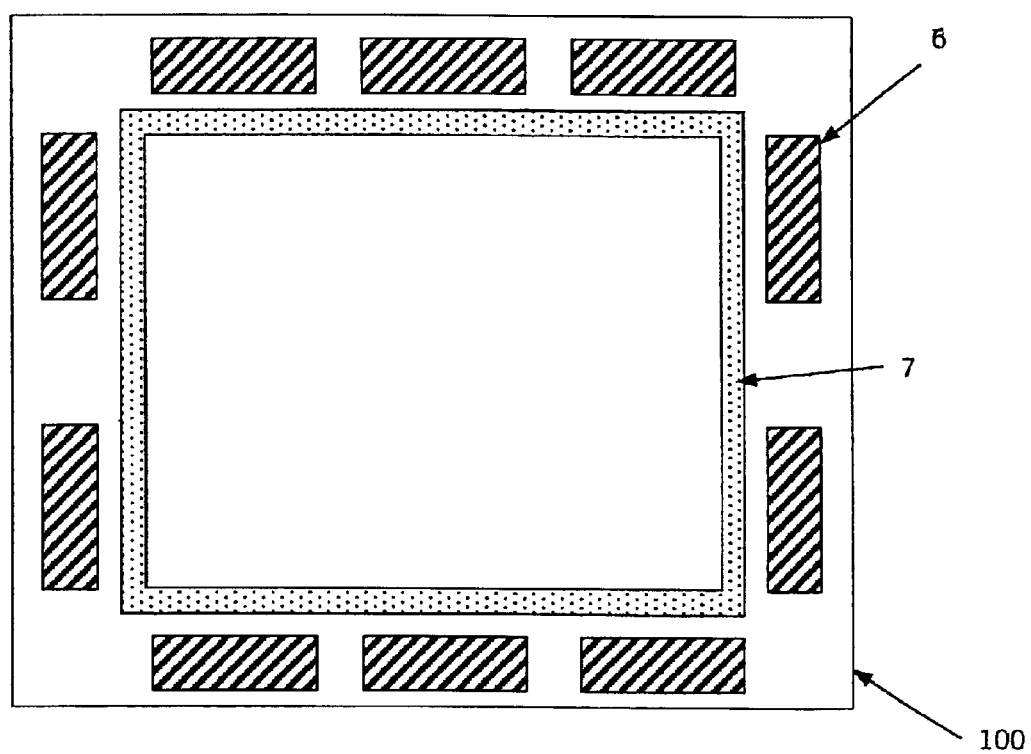
FIG. 7 is a plan view showing still another embodiment of the present inveniton.

FIG. 7 is a plan view for explaining still another embodiment of the present inveniton. The structure employed in this embodiment is that a ring-shaped groove 7 is provided between a region for forming pads 6 and a region for forming line conductors (not shown) on semiconductor chip 100.

Each of pads 6 itself is solid because of its larger area compared with line conductors, and hardly peel off or deform, even if deformation is caused at a pad 6 during bonding process and reaches neibhoring pads 6.

In this embodiment, the groove has a rectangular shape in its plan view, however, there is no particular limitation in the shape of the groove, as far as it is intended to provied a discontinuity at least in the most upper interlayer insulation film. And also, there is no particular limitation in the depth and the shape of the bottom of the groove (e.g. a groove having U- or V-shaped cross-section).

According to the present invention, as explained above, the deformation caused in the interlayer insulation film during bonding process hardly propagate into WIRING REGION, and line conductors on the most upper interlayer insulation film can be prevented from their peeling off from the interlayer insulation film and the change in their high-frequency transmission characteristics.

What is claimed is:

1. A high-frequency semiconductor device comprising:
    a ground plate extending over a semiconductor substrate throughout with an insulation film intervening therebetween;
    a plurality of line conductors provided on said ground plate, forming a multiple layer structure with the intervention of interlayer insulation films, each of said interlayer insulation films being composed of a resin insulating material, and each of said line conductors forming a micro-strip line in conjunction with said ground plate, wherein said plurality of line conductors include one line conductor provided on the upper surface of the most upper one of said interlayer insulation films;
    a plurality of pads arranged in series on said upper surface of said most upper one of said interlayer insulation films, adjacent to and along a periphery of said semiconductor substrate; and
    a plurality of grooves provided in said most upper one of said interlayer insulation films, between each of said pads and said one line conductor on said upper surface of said most upper one of said interlayer insulation films, each of said grooves being formed adjacent to and surrounding a corresponding one of said pads,
    wherein each of said grooves is formed to bend along a corresponding one of said pads.

2. A high-frequency semiconductor device as set forth in claim 1, wherein said grooves is partially disposed in a region between said pad and said one line conductor on said upper surface of the most upper one of said interlayer insulation films.

3. A high-frequency semiconductor device as set forth in claim 2, wherein said pad has an edge closely facing to the periphery of said semiconductor substrate, and wherein said grooves is formed in a region of said upper surface of said most upper one of said interlayer insulation films, except the region between said edge of said pad and said periphery of said semiconductor substrate.

4. A high-frequency semiconductor device comprising:
    a ground plate extending over a semiconductor substrate throughout with an insulation film intervening therebetween;
    a plurality of line conductors provided on said ground plate, forming a multiple layer structure with the intervention of interlayer insulation films, each of said interlayer insulation films being composed of a resin insulating material, and each of said line conductors forming a micro-strip line in conjunction with said ground plate, wherein said plurality of line conductors include one line conductor provided on the upper surface on the most upper one of said interlayer insulation films;
    a pad provided on said upper surface of said most upper one of said interlayer insulation films; and
    a groove provided in said most upper one of said interlayer insulation films, between said pad and said one line conductor on said upper surface of said most upper one of said interlayer insulation films, adjacent to and surrounding said pad,
    wherein said groove is divided into a plurality of portions with at least one gap provided across said groove.

5. A high-frequency semiconductor device as set forth in claim 4, wherein said one line conductor on said upper surface of said most upper one of said interlayer insulation films extends to pass through said gap and connects with said pad.

6. A high-frequency semiconductor device comprising:
    a ground plate extending over a semiconductor substrate throughout with an insulation film intervening therebetween;
    a plurality of line conductors provided on said ground plate, forming a multiple layer structure with the intervention of interlayer insulation films, each of said interlayer insulation films being composed of a resin insulating material, and each of said line conductors forming a micro-strip line in conjunction with said ground plate, wherein said plurality of line conductors include one line conductor provided on the upper surface of the most upper one of said interlayer insulation films;

a plurality of pads arranged in series on said upper surface of said most upper one of said interlayer insulation films, adjacent to and along the periphery of said semiconductor substrate; and a groove having a ring shape, said groove being provided in said most upper one of said interlayer insulation films, inside the serial arrangement of said plurality of pads, between said pads and said one line conductor on said upper surface of said most upper one of said interlayer insulation films, and adjacent to said pads.

7. A high-frequency semiconductor device as set forth in claim 1, further comprising a through-hole provided in said most upper one of said interlayer insulation films, for connecting said pad on said upper surface of said most upper one of said interlayer insulation films to one said line conductor extending thereunder.

8. A high-frequency semiconductor device as set forth in claim 1, wherein said interlayer insulation film is composed of a polyamide or a benzocyclobutene.

9. A high-frequency semiconductor device having microstrip lines, comprising:

a ground plate extending over a semiconductor substrate with an insulation film intervening therebetween;

a plurality of line conductors provided on said ground plate, forming a multiple layer structure with the intervention of interlayer insulation films including one provided between said ground plate and the lowest one of said line conductors, each of said interlayer insulation films being composed of a resin insulating material, said plurality of line conductors including one formed on the upper surface of the most upper one of said interlayer insulation films;

a plurality of pads arranged in series on said upper surface of said most upper one of said interlayer insulation films, adjacent to and along the periphery of said semiconductor substrate; and a groove for preventing deformation caused in said most upper one of said interlayer insulation films by a force applied to said pad during a wire bonding process to propagate from the region under said pad to a region of said upper surface of said most upper one of said interlayer insulation films, on which one of said line conductors is formed, said groove being provided in said most upper one of said interlayer insulation films, and between each of said pads and one said line conductor on said upper surface of said most upper one of said interlayer insulation films.

10. A high-frequency semiconductor device as set forth in claim 6, further comprising a plurality of through-holes provided in said most upper one of said interlayer insulation films, for connecting said pads said line conductors extending thereunder.

11. A high-frequency semiconductor device as set forth in claim 6, wherein said interlayer insulation film is composed of a polyamide or a benzocyclobutene.

12. A high-frequency semiconductor device as set forth in claim 4, wherein said interlayer insulation film is composed of a polyimide or a benzocyclobutene.

* * * * *